(12) United States Patent
Zeng

(10) Patent No.: US 12,512,373 B2
(45) Date of Patent: Dec. 30, 2025

(54) SEMICONDUCTOR DEVICE LAYOUT STRUCTURE, METHOD FOR FORMING SAME, AND TEST SYSTEM

(71) Applicant: CHANGXIN MEMORY TECHNOLOGIES, INC., Hefei (CN)

(72) Inventor: Yizhi Zeng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 403 days.

(21) Appl. No.: 18/155,769

(22) Filed: Jan. 18, 2023

(65) Prior Publication Data

US 2024/0071844 A1   Feb. 29, 2024

(51) Int. Cl.
*H01L 21/66* (2006.01)
*H01L 23/482* (2006.01)

(52) U.S. Cl.
CPC .......... *H01L 22/32* (2013.01); *H01L 23/4824* (2013.01)

(58) Field of Classification Search
CPC ................................................ H01L 21/76816
See application file for complete search history.

(56) References Cited

U.S. PATENT DOCUMENTS 10,423,078 B1 * 9/2019 Shen ................ H01L 21/76816
2022/0157764 A1   5/2022 Kim et al.

FOREIGN PATENT DOCUMENTS

CN       114520204 A    5/2022

* cited by examiner

*Primary Examiner* — Edward Chin
(74) *Attorney, Agent, or Firm* — Kilpatrick Townsend & Stockton LLP

(57) ABSTRACT

Embodiments relate to the field of semiconductor, and disclose a semiconductor device layout structure, a method for forming the same, and a test system. The semiconductor device layout structure includes: an active layout layer including active pattern regions arranged along a first direction; device layout sublayers, where each of the device layout sublayer includes a gate pattern region; and a plurality of contact plug sets, where each of the contact plug sets includes a source contact plug and a drain contact plug. Along the first direction, in adjacent two gate pattern regions of the device layout sublayers, a pitch between the latter gate pattern region and the corresponding source contact plug and/or the drain contact plug and a pitch between the former gate pattern region and the corresponding source contact plug and/or the drain contact plug form an arithmetic progression.

10 Claims, 2 Drawing Sheets

First Direction

SEMICONDUCTOR DEVICE LAYOUT STRUCTURE, METHOD FOR FORMING SAME, AND TEST SYSTEM

CROSS REFERENCE TO RELATED APPLICATION

This application claims priority to Chinese Patent Application No. 202211035535.3, titled "SEMICONDUCTOR DEVICE LAYOUT STRUCTURE, METHOD FOR FORMING SAME, AND TEST SYSTEM" and filed to the State Patent Intellectual Property Office on Aug. 26, 2022, the entire contents of which are incorporated herein by reference.

TECHNICAL FIELD

The present disclosure relates to the field of semiconductor, and more particularly, to a semiconductor device layout structure, a method for forming the same, and a test system.

BACKGROUND

As a design line width of a memory is gradually reduced, an integration level of a device is gradually increased, and a pitch between a gate and a contact plug is shorter, which leads to a more serious problem of leakage. Therefore, in semiconductor process control, how to design and define a process window between the gate and the contact plug is very important to ensure final performance of the memory.

SUMMARY

The present disclosure discloses a semiconductor device layout structure, a method for forming the same, and a test system.

According to a first aspect of the present disclosure, there is provided a semiconductor device layout structure, which includes: an active layout layer provided in a substrate, where the active layout layer comprises a plurality of active pattern regions, and an arrangement direction of the plurality of active pattern regions forms a first direction; a plurality of device layout sublayers, wherein each of the plurality of device layout sublayer is positioned on a side of a corresponding one of the plurality of active pattern regions facing away from the substrate, and each of the plurality of device layout sublayer comprises a gate pattern region, a source pattern region, and a drain pattern region; and a plurality of contact plug sets, where each of the plurality of contact plug sets is positioned on a side of a corresponding one of the plurality of device layout sublayers facing away from the substrate, and each of the plurality of contact plug sets comprises a source contact plug and a drain contact plug, the source contact plug is connected to the source pattern region, the drain contact plug is connected to the drain pattern region, and along the first direction, a pitch between the source contact plug and the drain contact plug is a fixed value; along the first direction, the gate pattern region in each of the plurality of device layout sublayers is positioned between the corresponding source contact plug and the corresponding drain contact plug; and along the first direction, in adjacent two of the plurality of device layout sublayers, a pitch between the latter gate pattern region and the corresponding source contact plug and a pitch between the former gate pattern region and the corresponding source contact plug form an arithmetic progression, and/or, in the adjacent two of the plurality of device layout sublayers, a pitch between the latter gate pattern region and the corresponding drain contact plug and a pitch between the former gate pattern region and the corresponding drain contact plug form an arithmetic progression.

According to a second aspect of the present disclosure, there is provided a test system, which includes the semiconductor device layout structure provided in any one of the above technical solutions.

According to a third aspect of the present disclosure, there is provided a method for forming a semiconductor device layout structure, which includes: providing a substrate; forming an active layout layer in the substrate, where the active layout layer comprises a plurality of active pattern regions, and an arrangement direction of the plurality of active pattern regions forms a first direction; and forming a plurality of device layout sublayers and a plurality of contact plug sets on the active layout layer, each of the plurality of contact plug sets being positioned on a side of a corresponding one of the plurality of device layout sublayers facing away from the substrate; where each of the plurality of device layout sublayers corresponds to one of the plurality of active pattern regions, and each of the plurality of device layout sublayers comprises a gate pattern region, a source pattern region, and a drain pattern region; each of the plurality of contact plug sets comprises a source contact plug and a drain contact plug, the source contact plug is connected to the source pattern region, the drain contact plug is connected to the drain pattern region, and along the first direction, a pitch between the source contact plug and the drain contact plug is a fixed value; along the first direction, the gate pattern region in each of the plurality of device layout sublayers is positioned between the corresponding source contact plug and the corresponding drain contact plug; and along the first direction, in adjacent two of the plurality of device layout sublayers, a pitch between the latter gate pattern region and the corresponding source contact plug and a pitch between the former gate pattern region and the corresponding source contact plug form an arithmetic progression, and/or, in the adjacent two of the plurality of device layout sublayers, a pitch between the latter gate pattern region and the corresponding drain contact plug and a pitch between the former gate pattern region and the corresponding drain contact plug form an arithmetic progression.

REFERENCE NUMERALS

100—active pattern region; 200—gate pattern region; 300—source contact plug; 400—drain contact plug; 500—gate contact plug; 600—first connection pattern region; 700—second connection pattern region; 800—third connection pattern region; 900—other structural layer; 910—metal silicide layer; 920—contact hole stop layer; 01—gate test terminal; 02—source test terminal; 03—drain test terminal; S—source pattern region; and D—drain pattern region.

DETAILED DESCRIPTION

Typical embodiments embodying features and advantages of the present disclosure will be described in detail in the following specification. It is to be understood that the present disclosure may have various changes on different embodiments, which does not depart from the scope of the present disclosure, and the description and accompanying drawings therein in essence are used for illustrating but not intended for limiting the present disclosure.

In the following description of different exemplary embodiments of the present disclosure, it is made with reference to the accompanying drawings, which form a part of the present disclosure, and therein different exemplary structures, systems and steps that can implement various aspects of the present disclosure are shown by way of example. It is to be understood that other solutions of components, structures, exemplary apparatuses, systems, and steps may be used, and structural and functional modifications may be made without departing from the scope of the present disclosure. Moreover, although the terms "above", "between", "within", etc. may be used in this specification to describe different exemplary features and elements of the present disclosure, these terms are used herein for convenience only, such as directions of the examples in the accompanying drawings. Nothing in this specification should be understood as requiring a three-dimensional direction of the structure to fall within the scope of the present disclosure.

Figure 1:
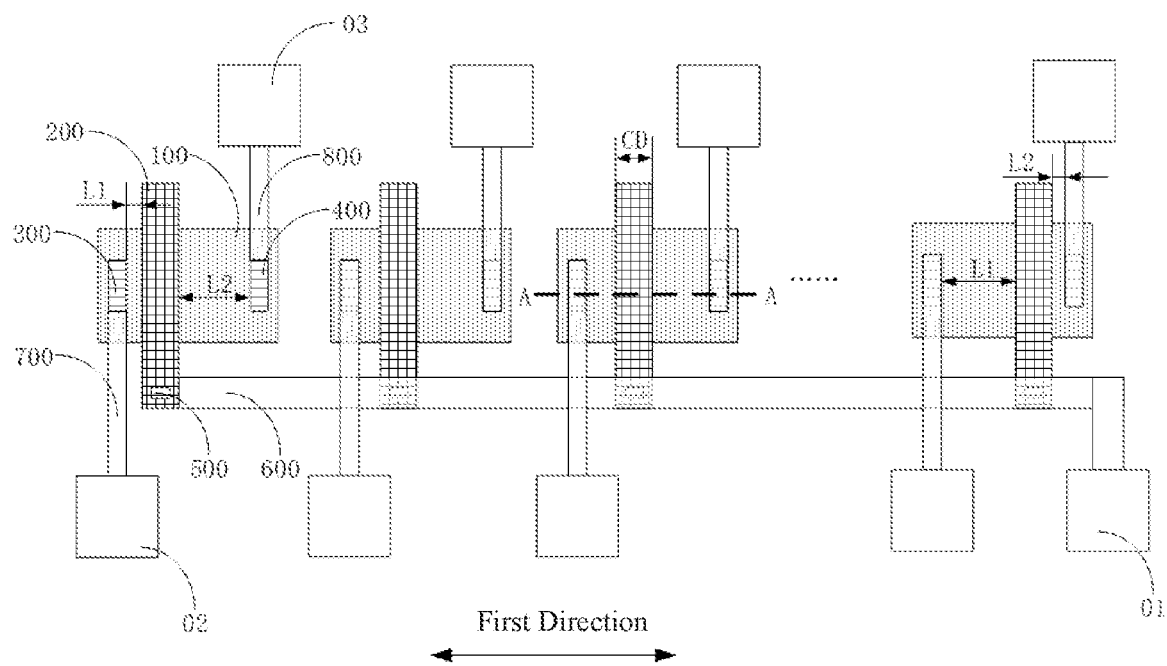
FIG. 1 is a schematic structural diagram of a semiconductor device layout structure according to an embodiment of the present disclosure.
Figure 2:
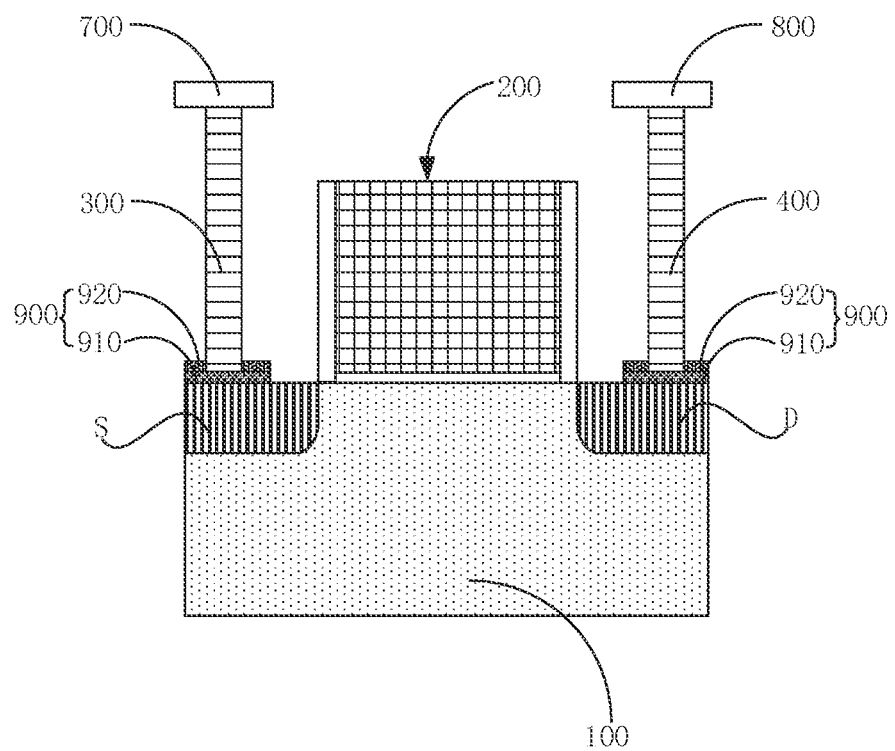
FIG. 2 is a cross-sectional diagram at a position A-A in FIG. 1.

In a first aspect, the embodiments of the present disclosure provide a semiconductor device layout structure. FIG. 1 is a schematic structural diagram of a semiconductor device layout structure according to an embodiment of the present disclosure; and FIG. 2 is a cross-sectional diagram at a position A-A in FIG. 1. Referring to the structure shown in FIG. 1 in conjunction with FIG. 2, the semiconductor device layout structure provided by the embodiments of the present disclosure includes: an active layout layer provided in a substrate, where the active layout layer comprises a plurality of active pattern regions 100, and an arrangement direction of the plurality of active pattern regions 100 forms a first direction; a plurality of device layout sublayers, where each of the plurality of device layout sublayer is positioned on a side of a corresponding one of the plurality of active pattern regions 100 facing away from the substrate, as shown in FIG. 2, and each of the plurality of device layout sublayer comprises a gate pattern region 200, a source pattern region S, and a drain pattern region D; and a plurality of contact plug sets, where each of the plurality of contact plug sets is positioned on a side of a corresponding one of the plurality of device layout sublayers facing away from the substrate. With continued reference to the structure shown in FIG. 1 and FIG. 2, each of the plurality of contact plug sets comprises a source contact plug 300 and a drain contact plug 400, where the source contact plug 300 is connected to the source pattern region S, the drain contact plug 400 is connected to the drain pattern region D, and along the first direction, a pitch between the source contact plug 300 and the drain contact plug 400 is a fixed value, Along the first direction, the gate pattern region 200 in each of the plurality of device layout sublayers is positioned between the corresponding source contact plug 300 and the corresponding drain contact plug 400. Along the first direction, in adjacent two of the plurality of device layout sublayers, a pitch between the latter gate pattern region 200 and the corresponding source contact plug 300 and a pitch between the former gate pattern region 200 and the corre- sponding source contact plug 300 form an arithmetic progression, and/or, in the adjacent two of the plurality of device layout sublayers, a pitch between the latter gate pattern region 200 and the corresponding drain contact plug 400 and a pitch between the former gate pattern region 200 and the corresponding drain contact plug 400 form an arithmetic progression.

In some embodiments, in the semiconductor device layout structure, the active layout layer formed in the substrate includes a plurality of active pattern regions 100, and the plurality of active pattern regions 100 form a first direction. Along the first direction, in a contact plug set corresponding to each active pattern region 100, the pitch between the source contact plug 300 and the drain contact plug 400 is a fixed value, a gate pattern region 200 is placed between the source contact plug 300 and the drain contact plug 400, and a preset pitch is provided between the gate pattern region 200 and the source contact plug 300 and/or the drain contact plug 400.

It is to be understood that, along the first direction, the pitch between the source contact plug 300 and the drain contact plug 400 is the fixed value, which means that the pitch between the source contact plug 300 and the drain contact plug 400 corresponding to each active pattern region 100 is consistent. For example, if a side edge of the source contact plug 300/drain contact plug 400 facing the drain contact plug 400/source contact plug 300 is taken as a reference point, the pitch between the source contact plug 300 and the drain contact plug 400 corresponding to each active pattern region 100 adopt the same reference point.

Similarly, the "preset pitch" may mean that: along the first direction, a side edge of the source contact plug 300 and/or the drain contact plug 400 and the gate pattern region 200 facing the gate pattern region 200 and the drain contact plug 400 and/or the source contact plug 300 is taken as a reference point.

When the semiconductor device layout structure provided by the embodiments of the present disclosure is fabricated, the gate pattern region 200 in each device layout sublayer is related to a position of the corresponding source contact plug 300 and/or the drain contact plug 400. In some embodiments, when the position of the gate pattern region 200 or the contact plug set in the embodiments of the present disclosure are fabricated, it is necessary to satisfy: along the first direction, in the adjacent device layout sublayers, a pitch between the latter gate pattern region 200 and the corresponding source contact plug 300 and a pitch between the former gate pattern region 200 and the corresponding source contact plug 300 form an arithmetic progression, and/or, in the adjacent device layout sublayers, a pitch between the latter gate pattern region 200 and the corresponding drain contact plug 400 and a pitch between the former gate pattern region 200 and the corresponding drain contact plug 400 form an arithmetic progression.

It is to be noted that, such a setting form allows the setting position of the gate pattern region 200 is correlated with that of the corresponding source contact plug 300 and/or the drain contact plug 400. In this way, the accuracy of the setting positions of the source contact plug 300 and/or the drain contact plug 400 and the gate pattern region 200 may be improved.

In general, in the semiconductor device layout structure provided in the embodiments of the present disclosure, along the first direction, the pitch between the source contact plug 300 and the drain contact plug 400 in the contact plug set corresponding to each active pattern region 100, and the position of the gate pattern region 200 between the source contact plug 300 and the drain contact plug 400 are both strictly controlled. In this way, the accuracy of the setting positions of the source contact plug 300 and/or the drain contact plug 400 and the gate pattern region 200 may be improved, and the leakage current in the pitch between the gate pattern region 200 and the source contact plug 300 and/or the drain contact plug 400 caused by the overlay error (PC-PG OVL) of gate pattern region-contact plug pitch may be analyzed and tested in time, thereby improving the product yield.

It is to be understood that prior to the fabrication, the positions of the source contact plug 300 and/or the drain contact plug 400 and the gate pattern region 200 corresponding to each active pattern region 100 have been strictly set already. Therefore, the test platform for one process window may be provided to subsequently analyze and evaluate the influences on the process window based on the overlay error between the gate pattern region 200 and the source contact plug 300/drain contact plug 400, thereby improving the final product yield.

Moreover, because a plurality of such layout structures may be placed on a wafer, a leakage current in the pitch between the gate pattern region 200 and the source contact plug 300 and/or the drain contact plug 400 caused by a critical dimension (CD) of the gate may also be analyzed and tested by means of a process of an energy-depth of field matrix (CD FEM). Thus, an optimal combination of CD and OVL may be obtained effectively. The semiconductor device layout structure provided in the embodiments of the present disclosure not only can provide the test platform for the process window, which provides possibility for subsequent process verification, but also can effectively save experimental time and improve efficiency.

It is to be noted that, the preset pitch between each gate pattern region 200 and the source contact plug 300 and/or the drain contact plug 400 may be a fixed value or a variable value. In settings, the difference in the arithmetic progression may be 0, a numeric value greater than 0, and a numeric value less than 0. In one embodiment, in the plurality of device layout sublayers: along the first direction, the gate pattern regions 200 in the adjacent two of the plurality of device layout sublayers have an equal critical dimension; along the first direction, in the adjacent two of the plurality of device layout sublayers, the pitch between the latter gate pattern region 200 and the corresponding source contact plug 300 and the pitch between the former gate pattern region 200 and the corresponding source contact plug 300 form an increasing progression; and along the first direction, in the adjacent two of the plurality of device layout sublayers, the pitch between the latter gate pattern region 200 and the corresponding drain contact plug 400 and the pitch between the former gate pattern region 200 and the corresponding drain contact plug 400 form a decreasing progression.

In some embodiments, in the semiconductor device layout structure provided in the embodiments of the present disclosure, along the first direction, each gate pattern region 200 has a pitch requirement with respect to the corresponding source contact plug 300 and drain contact plug 400, and the dimensions of the gate pattern regions 200, the source contact plugs 300 and the drain contact plugs 400 in the adjacent device layout sublayers vary according to laws.

It is to be understood that the pitch between the source contact plug 300 and the drain contact plug 400 along the first direction is a fixed value, and the fixed value in each contact plug set is consistent. Therefore, when the pitch between the latter gate pattern region 200 and the corresponding source contact plug 300 and the pitch between the former gate pattern region 200 and the corresponding source contact plug 300 form an increasing progression, correspondingly, the pitch between the latter gate pattern region 200 and the corresponding drain contact plug 400 and the pitch between the former gate pattern region 200 and the corresponding drain contact plug 400 form a decreasing progression. Furthermore, the increasing progression and the decreasing progression have an equal common difference.

For example, in the structure shown in FIG. 1, along the first direction, the pitch between the source contact plug 300 and the gate pattern region 200 on the first active pattern region 100 is L1, and the pitch between the drain contact plug 400 and the gate pattern region 200 is L2; and the fixed value=L1+L2+the dimension of the gate pattern region 200 in the first direction. It is to be understood that, because the gate pattern region 200 has consistent dimension in the first direction, a total value of L1 and L2 in each contact plug set is a fixed value, and an increasing value of the adjacent L1 is equal to a decreasing value of the adjacent L2.

For example, if there are a plurality of, e.g., 16 active pattern regions 100 arranged along the first direction, on the first active pattern region 100: L1 is 2 mm, and L2 is 30 mm; on the second active pattern region 100: L1 is 4 mm, and L2 is 28 mm; on the third active pattern region 100, L1 is 6 mm, and L2 is 26 mm . . . and on the sixteenth active pattern region 100, L1 is 30 mm, and L2 is 2 mm. Along the first direction, the adjacent L1 increase with a common difference of 2 mm, and the adjacent L2 decrease with a common difference of 2 mm.

It is to be noted that, the positions of the gate pattern region 200, the source contact plug 300 and the drain contact plug 400 are double-defined by L1 and L2, which may avoid leakage due to closer dimensions between the gate pattern region 200 and the source contact plug 300 or the drain contact plug 400 caused by over-dimension of the gate pattern region 200 in the first direction. In this way, the accuracy of the setting positions of the source contact plug 300 and/or the drain contact plug 400 and the gate pattern region 200 may be further improved, and the leakage current in the pitch between the gate pattern region 200 and the source contact plug 300 and/or the drain contact plug 400 caused by the overlay error (PC-PG OVL) of gate pattern region-contact plug pitch may be better analyzed and tested, thereby further improving the product yield.

It is to be noted that, by means of the embodiments of the present disclosure, the critical dimension of the gate pattern region 100 may be a fixed value in the same semiconductor device layout structure, such that the influence of different OVLs on the leakage current may be observed.

In one embodiment, each contact plug set further includes a gate contact plug 500, which is connected to the gate pattern region 200.

It is to be noted that each gate pattern region 200 is connected to an external device through the gate contact plug 500 to implement conduction between the gate pattern region 200 and the external device.

In one embodiment, in each of the plurality of device layout sublayers, a vertical projection of at least part of the gate pattern region 200 on the substrate is positioned outside a vertical projection of the active pattern region 100 on the substrate.

It is to be noted that, this structural setting may facilitate other structural settings in the part of the gate pattern region 200 beyond the active pattern region 100, to improve space utilization of the semiconductor device layout provided in the embodiments of the present disclosure.

In one embodiment, the vertical projection of the gate contact plug 500 on the substrate is positioned outside the vertical projection of the corresponding active pattern region 100 on the substrate.

It is to be noted that, the gate contact plug 500 is disposed at the part of the gate pattern region 200 beyond the active pattern region 100, such that the source contact plug 300 and the drain contact plug 400 may be arranged according to an exposure limit within a range of the corresponding active pattern region, to prevent the pitch between the source contact plug 300 and the drain contact plug 400 from being too close, thereby reducing the fabrication difficulty of the semiconductor device layout structure provided in the embodiments of the present disclosure, and improving the integration level of the semiconductor device layout structure.

In one embodiment, in the contact plug set, a material of the source contact plug 300 is one of tungsten, aluminum, or copper; and/or a material of the drain contact plug 400 is one of tungsten, aluminum, or copper; and/or a material of the gate contact plug 500 is one of tungsten, aluminum, or copper.

In some embodiments, the material of the source contact plug 300, of the gate contact plug 500 or of the drain contact plug 400 may be tungsten, aluminum, or copper. It is to be noted that the above materials can ensure a conduction effect between a source, a drain, or a gate and an external structure.

Of course, the source contact plug 300, the gate contact plug 500 or the drain contact plug 400 may also be made of other materials that can achieve electrical connection, and the details are not to be repeated.

It is worth noting that, to improve performance of connection between the contact plug set and the structure, other structure layers 900 may also be provided between the contact plug and the corresponding structure. In one embodiment, with continued reference to the structure shown in FIG. 2, to improve an ohmic contact between the contact plug and the gate pattern region 200, the source pattern region S, and the drain pattern region D, a metal silicide layer 910 may also be formed at the bottom of the contact plug in contact with the gate pattern region 200, the source pattern region S, or the drain pattern region D.

Of course, to protect the metal silicide layer 910, a contact hole stop layer 920 may also be provided on the metal silicide layer 910, which may be provided according to requirements and not described herein again.

In one embodiment, with continued reference to the structures shown in FIG. 1 and FIG. 2, the semiconductor device layout structure provided by the embodiments of the present disclosure further includes a plurality of test groups, where each of the plurality of test groups is provided on a side of a corresponding one of the plurality of contact plug sets facing away from the substrate, and each of the plurality of test groups is connected to the corresponding one of the plurality of contact plug sets. Each of the plurality of test groups comprises a gate test terminal 01, a source test terminal 02, and a drain test terminal 03, where: the gate test terminal 01 is connected to the gate contact plug 500; the source test terminal 02 is connected to the source contact plug 300; and the drain test terminal 03 is connected to the drain contact plug 400.

It is to be noted that, for the gate pattern region 200 in each device layout sublayer, a leakage test may be performed on the gate pattern region 200 and the corresponding source contact plug 300 by connecting the source test terminal 02 and the gate test terminal 01. Similarly, the leakage test may be performed on the gate pattern region 200 and the corresponding drain contact plug 400 by connecting the drain test terminal 03 and the gate test terminal 01. Thus, it is convenient to select the satisfactory device layout sublayer and the corresponding contact plug set, to obtain the optimal or qualified dimension of the gate pattern region 200, the pitch between the gate pattern region 200 and the source contact plug 300, and the pitch between the gate pattern region 200 and the drain contact plug 400.

It is worth noting that, the position of the gate pattern region 200 between the corresponding source contact plug 300 and drain contact plug 400 in each of the plurality of device layout sublayers may be implemented by connecting the gate test terminal 01 and the source test terminal 02/the drain test terminal 03, and the process window for the gate pattern region 200 and the source contact plug 300 and/or the drain contact plug 400 may be obtained.

It is to be understood that, during testing, the same voltage needs to be applied to the gate test terminals 01 connected to the plurality of gate contact plugs 500, to maintain consistency.

In one embodiment, the gate contact plugs 500 in the plurality of contact plug sets are connected to the same gate test terminal 01.

It is to be noted that, the semiconductor device layout structure only needs to be provided with one gate connection terminal, and the occupied area of the whole test unit may be saved because the number of gate connection terminals is reduced. Meanwhile, the plurality of gate contact plugs 500 are connected to the same gate test terminal 01, which may ensure the voltage consistency and improve the test accuracy.

In one embodiment, with continued reference to the structures shown in FIG. 1 and FIG. 2, the semiconductor device layout structure provided by the embodiments of the present disclosure further includes a plurality of connection pattern groups, where each of the plurality of connection pattern groups is provided on a side of a corresponding one of the plurality of contact plug sets facing away from the substrate, and each of the plurality of connection pattern groups connects the corresponding one of the plurality of contact plug sets with a corresponding one of the plurality of test groups. Each of the plurality of connection pattern groups comprises a first connection pattern region 600, a second connection pattern region 700, and a third connection pattern region 800, where: the first connection pattern region 600 connects the source contact plug 300 with the source test terminal 02; the second connection pattern region 700 connects the drain contact plug 400 with the drain test terminal 03; and the third connection pattern region 800 connects the gate contact plug 500 with the gate test terminal 01.

It is to be noted that patterns of the first connection pattern region 600, the second connection pattern region 700, and the third connection pattern region 800 may be set according to requirements to rationally utilize internal space of the semiconductor device.

It is worth noting that, to clearly illustrate the source contact plug 300 and the drain contact plug 400, the first connection pattern region 600 does not cover the source contact plug 300 and the second connection pattern region 700 does not cover the drain contact plug 400 at corresponding positions of the first active pattern region 100. Substantially, at least part of the first connection pattern region 600 covers the top of the source contact plug 300 and at least part of the second connection pattern region 700 covers the top of the drain contact plug 400 at, for example, corresponding positions of other active pattern regions 100.

In one embodiment, among the plurality of connection pattern groups, materials of the first connection pattern region 600, of the second connection pattern region 700, and of the third connection pattern region 800 are the same. It is to be understood that the first connection pattern region 600, the second connection pattern region 700 and the third connection pattern region 800 may be made of metallic materials commonly used in the art.

It is to be noted that when the first connection pattern region 600, the second connection pattern region 700 and the third connection pattern region 800 are made of the same material, the fabrication processes may be simplified to improve fabrication efficiency.

Of course, the materials of the first connection pattern region 600, of the second connection pattern region 700, and of the third connection pattern region 800 may also be different to meet connection requirements of different parts.

In a second aspect, the embodiments of the present disclosure provides a test system, which comprises the semiconductor device layout structure as provided by any technical solution in the first aspect.

It is to be noted that, by providing the plurality of semiconductor device layout structures, the test system provided by the embodiments of the present disclosure can timely analyze and test a leakage current in the pitch between the gate pattern region 200 and the source contact plug 300 and/or the drain contact plug 400 caused by the overlay error (PC-PG OVL) of the pitch between the gate pattern region and the contact plug, which can effectively save experimental time and improve efficiency.

It is to be understood that prior to the fabrication, the positions of the source contact plug 300 and/or the drain contact plug 400 and the gate pattern region 200 corresponding to each active pattern region 100 have been strictly set already. Therefore, the test platform for one process window may be provided to subsequently analyze and evaluate the influences on the process window based on the overlay error between the gate pattern region 200 and the source contact plug 300/drain contact plug 400, thereby improving the final product yield.

It is worth noting that, in the embodiments of the present disclosure, the critical dimension of the gate pattern region 100 may be a fixed value in the same semiconductor device layout structure. Therefore, the influences of different OVLs on the leakage current may be observed in the test system provided by the embodiments of the present disclosure.

In the embodiments of the present disclosure, a plurality of layout structures may be correspondingly placed in a plurality of exposure units of the wafer, and the leakage current in the pitch between the gate pattern region 200 and the source contact plug 300 and/or the drain contact plug 400 caused by the critical dimension of the gate may be analyzed and tested by means of a process of an energy-depth of field matrix (CD FEM).

In one embodiment, there are a plurality of semiconductor device layout structures in the test system provided by the embodiments of the present disclosure, and the gate pattern regions in the plurality of semiconductor device layout structures have different critical dimensions (CD). In some embodiments, in the plurality of semiconductor device layout structures, the critical dimensions of the gate pattern regions 200 in adjacent semiconductor device layout devices form an increasing progression. It is to be understood that the increasing progression may also be described as a decreasing progression because sequential order is not defined.

For example, if the gate pattern regions 200 in each semiconductor device layout structure are progressively increased with a common difference of 2 mm, the critical dimension (CD) of the gate pattern region 200 in the latter semiconductor device layout structure is 2 mm greater than the critical dimension (CD) of the gate pattern region 200 in the former semiconductor device layout structure.

It is worth noting that when a plurality of layout structures are placed on the wafer, the OVL values of the plurality of layout structures are equal. By adjusting the critical dimensions (CD) of the gates in different layout structures, the influences of the critical dimensions (CD) of different gate pattern regions 200 on the leakage current may be observed.

It is to be understood that, when the critical dimensions (CD) of the gate pattern regions 200 in the plurality of semiconductor layout structures are set to progressively increase or decrease in sequence, the experiment time may be effectively saved and the efficiency may be effectively improved, such that influence laws of the critical dimensions (CD) of the gate pattern regions 200 on the leakage current may be quickly summarized.

It is to be noted that, when a plurality of layout structures are placed on the wafer, the OVL values of the plurality of layout structures are the same. By adjusting the critical dimensions (CD) of the gates in different layout structures to change according to the laws, it is convenient to observe change laws of the influences of the critical dimensions (CD) of different gate pattern regions on the leakage current.

In a third aspect, the embodiments of the present disclosure provide a method for forming a semiconductor device layout structure. The method for forming the semiconductor device layout structure includes: providing a substrate; forming an active layout layer in the substrate, where the active layout layer comprises a plurality of active pattern regions 100, and an arrangement direction of the plurality of active pattern regions 100 forms a first direction; and forming a plurality of device layout sublayers and a plurality of contact plug sets on the active layout layer, where each of the plurality of contact plug sets is positioned on a side of a corresponding one of the plurality of device layout sublayers facing away from the substrate. Each of the plurality of device layout sublayers corresponds to one of the plurality of active pattern regions 100, and each of the plurality of device layout sublayers comprises a gate pattern region 200, a source pattern region S, and a drain pattern region D. Each of the plurality of contact plug sets comprises a source contact plug 300 and a drain contact plug 400, where the source contact plug 300 is connected to the source pattern region S, the drain contact plug 400 is connected to the drain pattern region D, and along the first direction, a pitch between the source contact plug 300 and the drain contact plug 400 is a fixed value. Along the first direction, the gate pattern region 200 in each of the plurality of device layout sublayers is positioned between the corresponding source contact plug 300 and the corresponding drain contact plug 400. Along the first direction, in adjacent two of the plurality of device layout sublayers, a pitch between the latter gate pattern region 200 and the corresponding source contact plug 300 and a pitch between the former gate pattern region 200 and the corresponding source contact plug 300 form an arithmetic progression, and/or, in the adjacent two of the plurality of device layout sublayers, a pitch between the latter gate pattern region 200 and the corresponding drain contact plug 400 and a pitch between the former gate pattern region 200 and the corresponding drain contact plug 400 form an arithmetic progression.

It is to be noted that, when the semiconductor device layout structure is fabricated, the gate pattern region 200 in each device layout sublayer is related to a position of the corresponding source contact plug 300 and/or the drain contact plug 400. In some embodiments, when the position of the gate pattern region 200 or the contact plug set are fabricated, it is necessary to satisfy: along the first direction, in the adjacent device layout sublayers, a pitch between the latter gate pattern region 200 and the corresponding source contact plug 300 and a pitch between the former gate pattern region 200 and the corresponding source contact plug 300 form an arithmetic progression, and/or, in the adjacent device layout sublayers, a pitch between the latter gate pattern region 200 and the corresponding drain contact plug 400 and a pitch between the former gate pattern region 200 and the corresponding drain contact plug 400 form an arithmetic progression.

It is worth noting that, a setting position of the gate pattern region 200 is correlated with that of the corresponding source contact plug 300 and/or the drain contact plug 400. In this way, the accuracy of the setting positions of the source contact plug 300 and/or the drain contact plug 400 and the gate pattern region 200 may be improved, and the leakage current in the pitch between the gate pattern region 200 and the source contact plug 300 and/or the drain contact plug 400 caused by the overlay error (PC-PG OVL) of the pitch between the gate pattern region and the contact plug may be analyzed and tested in time, thereby improving the product yield.

It is to be understood that prior to the fabrication, the positions of the source contact plug 300 and/or the drain contact plug 400 and the gate pattern region 200 corresponding to each active pattern region 100 have been strictly set already. Therefore, the test platform for one process window may be provided to subsequently analyze and evaluate the influences on the process window based on the overlay error between the gate pattern region 200 and the source contact plug 300/drain contact plug 400, thereby improving the final product yield.

Moreover, because a plurality of such layout structures may be placed on a wafer, a leakage current in the pitch between the gate pattern region 200 and the source contact plug 300 and/or the drain contact plug 400 caused by a critical dimension (CD) of the gate may also be analyzed and tested by means of a process of an energy-depth of field matrix (CD FEM). Thus, an optimal combination of CD and OVL may be obtained effectively. The semiconductor device layout structure provided in the embodiments of the present disclosure not only can provide the test platform for the process window, which provides possibility for subsequent process verification, but also can effectively save experimental time and improve efficiency.

Of course, the semiconductor device layout structure in the first aspect may also be fabricated using the method for forming the semiconductor device layout structure provided by the embodiments of the present disclosure, and details thereof are not to be described any more.

Figure 3:
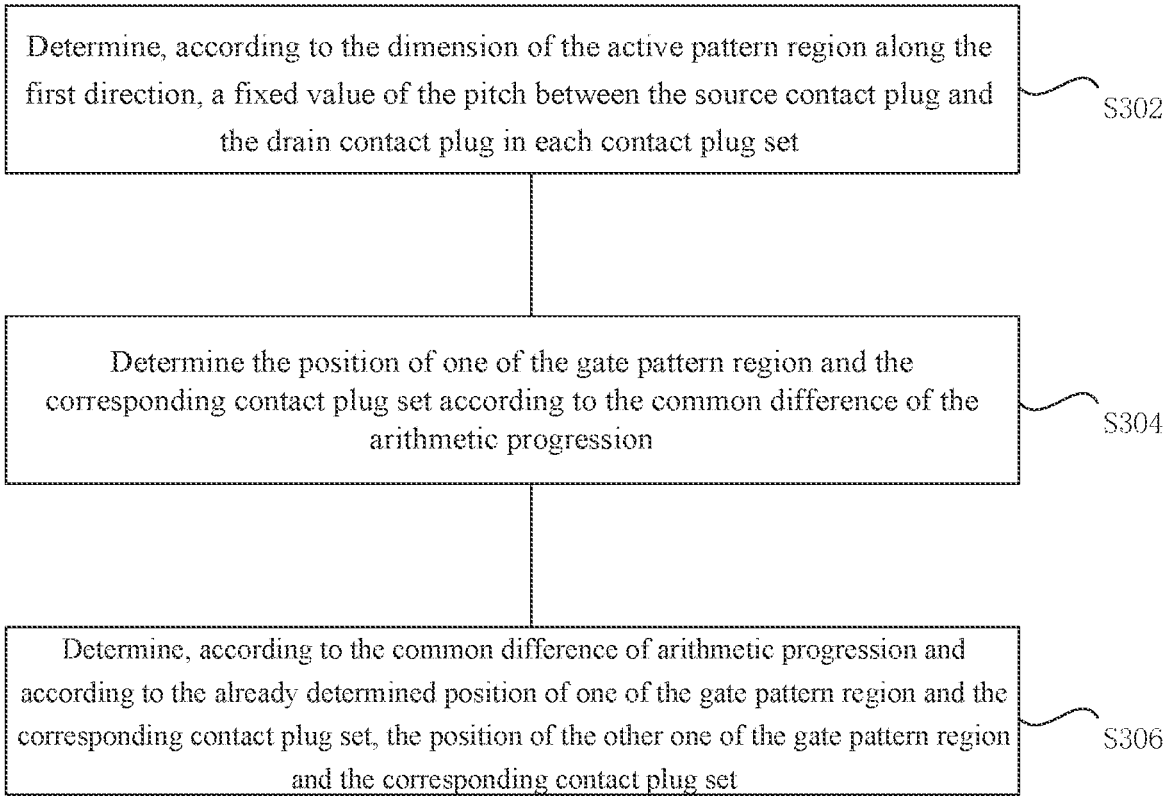
FIG. 3 is a schematic flow diagram of a method for forming a semiconductor device layout structure according to an embodiment of the present disclosure.

In one embodiment, as shown in FIG. 3, the method of forming a plurality of device layout sublayers and a plurality of contact plug sets on the active layout layer includes: Step S302: determining, according to the dimension of the active pattern region 100 along the first direction, a fixed value of the pitch between the source contact plug 300 and the drain contact plug 400 in each contact plug set; Step S304, determining the position of one of the gate pattern region 200 and the corresponding contact plug set according to the common difference of the arithmetic progression; and Step S306: determining, according to the common difference of arithmetic progression and according to the already determined position of one of the gate pattern region 200 and the corresponding contact plug set, the position of the other one of the gate pattern region 200 and the corresponding contact plug set.

It is to be noted that, such a setting form allows the setting position of the gate pattern region 200 is correlated with that of the corresponding source contact plug 300 and/or the drain contact plug 400. In this way, the accuracy of the setting positions of the source contact plug 300 and/or the drain contact plug 400 and the gate pattern region 200 may be improved.

It is to be understood that, determining the position of the contact plug set may refer to determining the position of the source contact plug 300 in each contact plug set, may also refer to determining the position of the drain contact plug 400, or may refer to simultaneously determining the position of the source contact plug 300 and the position of the drain contact plug 400, which may be set as required and is not to be described herein again.

It is worth noting that, because the pitch between the source contact plug 300 and the drain contact plug 400 is a fixed value along the first direction, if the position of only one of the source contact plug 300 and the drain contact plug 400 is determined before/after the fabrication of the gate pattern region 200, the position of the other one may be determined according to the fixed value, and setting may be made as required.

In the fabrication process, the values in the arithmetic progression may be 0, values greater than 0 and values less than 0. In one embodiment, critical dimensions of the gate pattern regions 200 in adjacent device layout sublayers are identical along the first direction. In Step S304, the step of determining, according to the common difference of the arithmetic progression, the position of one of the gate pattern region 200 and the corresponding contact plug set includes: controlling, along the first direction in the adjacent two of the plurality of device layout sublayers, the pitch between the latter gate pattern region 200 and the corresponding source contact plug 300 and the pitch between the former gate pattern region 200 and the corresponding source contact plug 300 to form an increasing progression; and controlling, along the first direction in the adjacent two of the plurality of device layout sublayers, the pitch between the latter gate pattern region 200 and the corresponding drain contact plug 400 and the pitch between the former gate pattern region 200 and the corresponding drain contact plug 400 to form a decreasing progression.

In some embodiments, in the method provided in the embodiments of the present disclosure, along the first direction, each gate pattern region 200 has a pitch requirement with respect to the corresponding source contact plug 300 and drain contact plug 500, and the dimensions of the gate pattern regions 200, the source contact plugs 300 and the drain contact plugs 400 in the adjacent device layout sublayers vary according to laws.

It is to be understood that the pitch between the source contact plug 300 and the drain contact plug 400 along the first direction is a fixed value, and the fixed value in each contact plug set is consistent. Therefore, when the pitch between the latter gate pattern region 200 and the corresponding source contact plug 300 and the pitch between the former gate pattern region 200 and the corresponding source contact plug 300 form an increasing progression, correspondingly, the pitch between the latter gate pattern region 200 and the corresponding drain contact plug 400 and the pitch between the former gate pattern region 200 and the corresponding drain contact plug 400 form a decreasing progression. Furthermore, the increasing progression and the decreasing progression have an equal common difference.

For example, in the structure shown in FIG. 1, along the first direction, the pitch between the source contact plug 300 and the gate pattern region 200 on the first active pattern region 100 is L1, and the pitch between the drain contact plug 400 and the gate pattern region 200 is L2; and the fixed value=L1+L2+the dimension of the gate pattern region 200 in the first direction. It is to be understood that, because the gate pattern region 200 has consistent dimension in the first direction, a total value of L1 and L2 in each contact plug set is a fixed value, and an increasing value of the adjacent L1 is equal to a decreasing value of the adjacent L2.

For example, if there are a plurality of, e.g., 16 active pattern regions 100 arranged along the first direction, on the first active pattern region 100: L1 is 2 mm, and L2 is 30 mm; on the second active pattern region 100: L1 is 4 mm, and L2 is 28 mm; on the third active pattern region 100, L1 is 6 mm, and L2 is 26 mm . . . and on the sixteenth active pattern region 100, L1 is 30 mm, and L2 is 2 mm. Along the first direction, the adjacent L1 increase with a common difference of 2 mm, and the adjacent L2 decrease with a common difference of 2 mm.

It is to be noted that, the positions of the gate pattern region 200, the source contact plug 300 and the drain contact plug 400 are double-defined by L1 and L2, which may avoid leakage due to closer dimensions between the gate pattern region 200 and the source contact plug 300 or the drain contact plug 400 caused by over-dimension of the gate pattern region 200 in the first direction. In this way, the accuracy of the setting positions of the source contact plug 300 and/or the drain contact plug 400 and the gate pattern region 200 may be further improved, thereby improving the product yield.

In one embodiment, along the first direction, in the adjacent two device layout sublayers, a differential between the critical dimension of the latter gate pattern region 200 and the critical dimension of the former gate pattern region 200 is equal. The step of determining, according to the common difference of the arithmetic progression, the position of one of the gate pattern region 200 and the corresponding contact plug set includes: in Step S304 of controlling the gate pattern region 200 in the adjacent two device layout sublayers along the first direction, controlling the pitch between the gate pattern region 200 and the source contact plug 300 or the drain contact plug 400 to be a fixed value, where the pitch between the gate pattern region 200 and the other one of the source contact plug 300 or the drain contact plug 400 to form an increasing progression or a decreasing progression.

In one embodiment, the method of forming a plurality of device layout sublayers and a plurality of contact plug sets on the active layout layer further includes: forming a gate contact plug 500 in each of the plurality of contact plug sets, where the gate contact plug 500 is connected to the corresponding gate pattern region 200, and a vertical projection of the gate contact plug 500 on the substrate is positioned outside a vertical projection of the corresponding active pattern region 100 on the substrate.

It is to be noted that, the gate contact plug 500 formed using this method is disposed at the part of the gate pattern region 200 beyond the active pattern region 100, such that the source contact plug 300 and the drain contact plug 400 may be arranged according to an exposure limit within a range of the corresponding active pattern region, to prevent the pitch between the source contact plug 300 and the drain contact plug 400 from being too close, thereby reducing the fabrication difficulty of the semiconductor device layout structure provided in the embodiments of the present disclosure, and improving the integration level of the semiconductor device layout structure.

In one embodiment, the method for forming the semiconductor device layout structure provided by the embodiment of the present disclosure further comprises: forming a plurality of test groups on the plurality of contact plug sets, where each of the plurality of test groups comprises a gate test terminal 01, a source test terminal 02, and a drain test terminal 03.

The gate test terminal 01 is connected to the gate contact plug 500.

The source test terminal 02 is connected to the source contact plug 300.

The drain test terminal 03 is connected to the drain contact plug 400.

It is to be noted that, for the gate pattern region 200 in each device layout sublayer, a leakage test may be performed on the gate pattern region 200 and the corresponding source contact plug 300 by connecting the source test terminal 02 and the gate test terminal 01. Similarly, the leakage test may be performed on the gate pattern region 200 and the corresponding drain contact plug 400 by connecting the drain test terminal 03 and the gate test terminal 01.

In one embodiment, the forming the plurality of test groups on the plurality of contact plug sets comprises: connecting the plurality of gate contact plugs 500 together; and connecting the plurality of gate contact plugs 500 connected together to the same gate test terminal 01.

It is to be noted that, the above method may simplify the fabrication processes and improve the fabrication efficiency. Meanwhile, the semiconductor device layout structure formed by the method only needs to be provided with one gate connection terminal, such that the occupied area of the whole test unit may be saved because the number of gate connection terminals is reduced. Meanwhile, the plurality of gate contact plugs 500 are connected to the same gate test terminal 01, which may ensure the voltage consistency and improve the test accuracy.

Other embodiments of the present disclosure will be apparent to those skilled in the art from consideration of the specification and practice of The present disclosure disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

It is to be appreciated that the present disclosure is not limited to the exact construction that has been described above and illustrated in the accompanying drawings, and that various modifications and changes may be made without departing from the scope thereof It is intended that the scope of the present disclosure only be limited by the appended claims.

What is claimed is:

1. A semiconductor device layout structure, comprising:
   an active layout layer provided in a substrate, the active layout layer comprising a plurality of active pattern regions, wherein an arrangement direction of the plurality of active pattern regions forms a first direction;

a plurality of device layout sublayers, wherein each of the plurality of device layout sublayer is positioned on a side of a corresponding one of the plurality of active pattern regions facing away from the substrate, and each of the plurality of device layout sublayer comprises a gate pattern region, a source pattern region, and a drain pattern region; and a plurality of contact plug sets, wherein each of the plurality of contact plug sets is positioned on a side of a corresponding one of the plurality of device layout sublayers facing away from the substrate, and each of the plurality of contact plug sets comprises a source contact plug and a drain contact plug, the source contact plug being connected to the source pattern region, the drain contact plug being connected to the drain pattern region, and along the first direction, a pitch between the source contact plug and the drain contact plug being a fixed value;

along the first direction, the gate pattern region in each of the plurality of device layout sublayers is positioned between the corresponding source contact plug and the corresponding drain contact plug; and along the first direction, in adjacent two of the plurality of device layout sublayers, a pitch between the latter gate pattern region and the corresponding source contact plug and a pitch between the former gate pattern region and the corresponding source contact plug forms an increasing arithmetic progression, and/or, in the adjacent two of the plurality of device layout sublayers, a pitch between the latter gate pattern region and the corresponding drain contact plug and a pitch between the former gate pattern region and the corresponding drain contact plug forms a decreasing arithmetic progression.

2. The semiconductor device layout structure according to claim 1, wherein along the first direction, the gate pattern regions in the adjacent two of the plurality of device layout sublayers have an equal critical dimension.

3. The semiconductor device layout structure according to claim 1, wherein each of the plurality of contact plug sets further comprises the gate contact plug, the gate contact plug being connected to the gate pattern region.

4. The semiconductor device layout structure according to claim 3, wherein in each of the plurality of device layout sublayers, a vertical projection of at least part of the gate pattern region on the substrate is positioned outside a vertical projection of the active pattern region on the substrate.

5. The semiconductor device layout structure according to claim 4, wherein a vertical projection of the gate contact plug on the substrate is positioned outside a vertical projection of the corresponding active pattern region on the substrate.

6. The semiconductor device layout structure according to claim 3, further comprising a plurality of test groups, wherein each of the plurality of test groups is provided on a side of a corresponding one of the plurality of contact plug sets facing away from the substrate, and each of the plurality of test groups is connected to the corresponding one of the plurality of contact plug sets; and each of the plurality of test groups comprises a gate test terminal, a source test terminal, and a drain test terminal, wherein the gate test terminal is connected to the gate contact plug;

wherein the source test terminal is connected to the source contact plug; and wherein the drain test terminal is connected to the drain contact plug.

7. The semiconductor device layout structure according to claim 6, wherein the gate contact plugs in the plurality of contact plug sets are connected to the same gate test terminal.

8. The semiconductor device layout structure according to claim 7, further comprising a plurality of connection pattern groups, wherein each of the plurality of connection pattern groups is provided on a side of a corresponding one of the plurality of contact plug sets facing away from the substrate, and each of the plurality of connection pattern groups connects the corresponding one of the plurality of contact plug sets with a corresponding one of the plurality of test groups; and each of the plurality of connection pattern groups comprises a first connection pattern region, a second connection pattern region, and a third connection pattern region, wherein the first connection pattern region connects the source contact plug with the source test terminal;

wherein the second connection pattern region connects the drain contact plug with the drain test terminal; and wherein the third connection pattern region connects the gate contact plug with the gate test terminal.

9. A test system, comprising the semiconductor device layout structure according to claim 1.

10. The test system according to claim 9, wherein there are a plurality of semiconductor device layout structures in the test system; and among the plurality of semiconductor device layout structures, the gate pattern regions in adjacent two of the plurality of semiconductor device layout structures have different critical dimensions.

* * * * *